US010453590B2

(12) United States Patent
Selvamanickam

(10) Patent No.: US 10,453,590 B2
(45) Date of Patent: Oct. 22, 2019

(54) SUPERCONDUCTOR AND METHOD FOR SUPERCONDUCTOR MANUFACTURING

(71) Applicant: University of Houston System, Houston, TX (US)

(72) Inventor: Venkat Selvamanickam, Houston, TX (US)

(73) Assignee: University of Houston System, Houston, TX (US)

( * ) Notice: Subject to any disclaimer, the term of this patent is extended or adjusted under 35 U.S.C. 154(b) by 653 days.

(21) Appl. No.: 13/907,356

(22) Filed: May 31, 2013

(65) Prior Publication Data
US 2015/0357088 A1 Dec. 10, 2015

Related U.S. Application Data

(60) Provisional application No. 61/654,330, filed on Jun. 1, 2012.

(51) Int. Cl.
*H01L 39/24* (2006.01)
*H01B 12/06* (2006.01)
*H01B 13/00* (2006.01)
*H01L 39/12* (2006.01)

(52) U.S. Cl.
CPC ......... *H01B 12/06* (2013.01); *H01B 13/0036* (2013.01); *H01L 39/126* (2013.01); *H01L 39/247* (2013.01)

(58) Field of Classification Search
CPC ..................................................... H01B 12/06
USPC .............................................................. 505/230
See application file for complete search history.

(56) References Cited

U.S. PATENT DOCUMENTS

| 5,140,006 A * | 8/1992 | Woolf .......................... 505/433 |
| 2005/0016759 A1 * | 1/2005 | Malozemoff et al. ...... 174/125.1 |
| 2005/0065035 A1 * | 3/2005 | Rupich et al. ................ 505/300 |
| 2005/0239659 A1 | 10/2005 | Xiong et al. |
| 2009/0088326 A1 * | 4/2009 | Baecker ....................... 505/434 |

FOREIGN PATENT DOCUMENTS

| JP | 2010287504 A | 12/2010 |
| JP | 2011520215 A | 7/2011 |
| KR | 20080097988 A | 11/2008 |

OTHER PUBLICATIONS

PCT/US2013/043698 International Search Report and Written Opinion dated Aug. 28, 2013 (13 p.).
Choi, Jeong-Kyu, "The Improvement in Critical Current Densities of Bi-2223/Ag HTS Tapes Via Pre-Heat Treatments and Cryogenic Rolling," Department of Materials Science & Engineering Graduate School, Kyungsung University, Feb. 2004 (67 p.).

* cited by examiner

*Primary Examiner* — Paul A Wartalowicz
(74) *Attorney, Agent, or Firm* — Blank Rome LLP

(57) ABSTRACT

Disclosed is a superconducting article comprising a silver overlayer consisting of no more than about 20% of grains over about 1 μm, having a minimum Vickers micro-hardness value of about 100, and a porosity of less than about 1%. A method of manufacturing a superconducting tape is disclosed as comprising, deposition of silver, oxygenation at about 400° C. for about 30 minutes, slitting, deposition of silver at a temperature of less than about 250° C., and application of copper.

17 Claims, 13 Drawing Sheets

SUPERCONDUCTOR AND METHOD FOR SUPERCONDUCTOR MANUFACTURING

CROSS-REFERENCE TO RELATED APPLICATIONS

This application claims the benefit under 35 U.S.C. § 119(e) of U.S. Provisional Patent Application No. 61/654,330 filed on Jun. 1, 2012, titled "Method for Superconductor Manufacturing" the entire disclosure of which is hereby incorporated herein by reference.

STATEMENT REGARDING FEDERALLY SPONSORED RESEARCH OR DEVELOPMENT

Not applicable.

BACKGROUND

Field of the Disclosure

This disclosure relates to superconductors, specifically to efficient methods of fabricating superconducting articles.

Background

Several materials and systems are being developed to solve the looming problems with energy generation, transmission, conversion, storage, and use. Superconductors may be a unique system solution across a broad spectrum of energy problems. Generally, superconductors enable high efficiencies in generators, power transmission cables, motors, transformers and energy storage. Further, superconductors have applications beyond energy, such as medicine, particle physics, communications, and transportation.

The superconductors are configured into various articles including wires, tapes, and other elongate structures for energy transmission. In some instances, these elongate superconducting articles are generally configured as superconducting tapes. Superconducting tapes are being developed, some of which include epitaxial, single-crystal-like thin films on polycrystalline substrates.

Generally, there are about 9 components in a typical second-generation (2G) High Temperature Superconductor (HTS) wire. There have been several different approaches are used to manufacture 2G HTS wire. In one instance, a biaxially-textured buffer layer is deposited on a substrate, typically made of a flexible metal such as a nickel alloy. The biaxially-textured buffer can be achieved by technique known in the art as Ion Beam Assisted Deposition (IBAD), Rolling Assisted Biaxially Textured Substrates (RABiTS), and Inclined Substrate Deposition (ISD). The superconductor film is deposited on the buffer layer by processes such as metal organic-chemical vapor deposition (MO-CVD), metal organic deposition (MOD), pulsed laser deposition (PLD) and electron-beam evaporation. Regardless of the method used to achieve biaxial texture, or the processes used for buffer or superconductor deposition, or the materials used for substrate, buffer, and superconductor, 2G HTS wire manufacturing of 2G HTS wire involves deposition of a silver over-layer atop the superconductor, followed by oxygenation heat treatment in an oxygen ambient.

In some instances, the wire manufacturing can include additional steps such as slitting, deposition of silver and further rounds of oxygenation heat treatment. Silver deposition is typically conducted by magnetron sputtering or evaporation. In some other instances, copper stabilizer may be applied over the silver layer prior to slitting or over the second silver over-layer after slitting. Electroplating, Electroless plating, lamination or other bonding techniques may be used to apply the copper stabilizer. Certain superconducting films that are processed by this technique exhibit critical current densities comparable to that achieved in epitaxial films grown on single crystal substrates. Using this technique, companies have demonstrated pilot-scale manufacturing of superconducting composite tapes. These tapes form a single crystal-like epitaxial film that is now being manufactured in lengths over a kilometer using a polycrystalline substrate base.

However, the most expensive step is deposition of the superconducting film, and the product becomes a high value added product after this step. Any yield loss after this step can have a significant negative impact on manufacturing cost, throughput, and efficiency. Furthermore, if the step of oxygenation is not conducted in a reel-to-reel mode, it requires substantial manual handling during which the high-value-added product is prone to damage and hence yield loss. Additionally, each of the two conventional oxygenation steps typically requires more than 20 hours, including handling time, and adds substantial time to manufacturing process.

BRIEF SUMMARY

As disclosed there is method for manufacturing a superconducting article, comprising a superconducting tape, in time-efficient manufacturing process that is directed to reducing product handling and the resultant risks related to yield loss.

In one embodiment of the present disclosure there is described a superconducting article comprising a silver overlayer consisting of no more than about 20% of grains over about 1 μm. Further, there is described a superconducting material comprising a silver overlayer having a minimum Vickers micro-hardness value of about 100. Additionally, a superconductor structure comprising a silver overlayer having a porosity of less than about 1% is described herein.

A method of manufacturing a superconducting tape comprises electro-polishing of substrate, deposition of buffer layers, deposition of superconductor, deposition of silver, oxygenation at 400° C. for 30 minutes, slitting, deposition of silver at a temperature of less than about 250° C., and electroplating of copper.

The embodiments described herein comprise a combination of features and/or characteristics intended to address various shortcomings associated with certain prior methods and products. The various features and/or characteristics described above, as well as others, will be readily apparent to those skilled in the art upon reading the following detailed description, and by referring to the accompanying drawings.

BRIEF DESCRIPTION OF THE DRAWINGS

For a detailed description of the disclosed exemplary embodiments of the invention, reference will now be made to the accompanying drawings in which.

DETAILED DESCRIPTION OF THE DISCLOSED EMBODIMENTS

Figure 1:
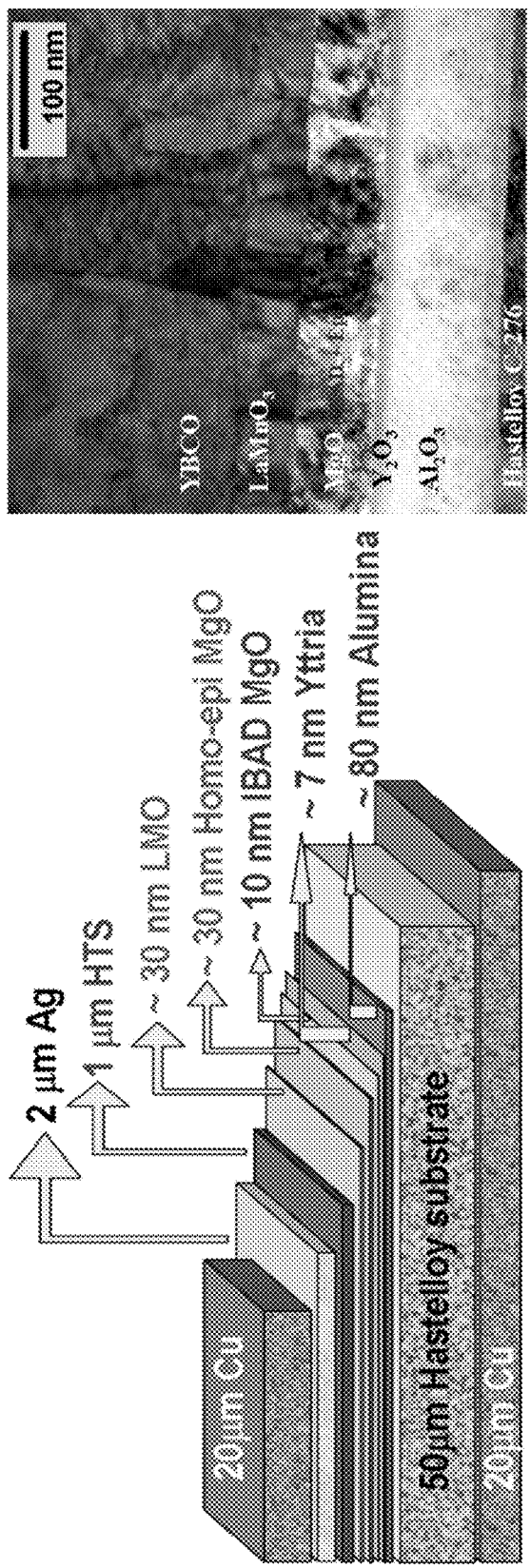
FIG. 1 illustrates a schematic cross-sectional microstructure of thin film superconducting tape adjacent to an electron micrograph thereof, the tape having been formed by a conventional manufacturing process.

Overview:

Disclosed herein, a thin film of materials with rock-salt crystal structure such as MgO is deposited by ion beam-assisted deposition over flexible, polycrystalline substrates. FIG. 1 shows a schematic and a cross sectional microstructure of a superconducting composite tape made with a conventional technology. However, conventional manufacturing methods have led to high yield losses. It may be understood that a reduction in the number of process steps may provide a commensurate reduction in the yield losses. Additionally, elimination of at least one process step may reduce cost related to manufacturing times. Furthermore, in order to reduce cost, the method of the present disclosure is intended to provide a reduced process time. More specifically as disclosed herein, the first oxygenation step duration has been reduced by more than a factor of two, the deposition of second silver has been reduced in temperature and the second oxygenation step has been eliminated when compared to a conventional process.

Conventional Process:

The oxygenation steps in the conventional process required 10 hours of dwell time at a temperature between about 450° C. and about 500° C., as well as a ramp up and ramp down time, which may add another about 8 hours. Including tape preparation time that exceed about 4 hours prior to and after oxygenation. As such, the total oxygenation time could be as much as about 22 hours. The long oxygenation time was conventionally believed to be necessary to ensure sufficient oxygen incorporation into the superconducting film as well as to establish a low contact resistance between the superconductor and the silver layer.

Additionally, in the conventional process, a second silver deposition step is performed after slitting, so as to cover the cut edges and encapsulate the tape with silver. Encapsulating the silver has conventionally been believed to protect the silver such that it is not chemically attacked by the electroplating solution during the copper deposition process. Due to process conditions used during silver sputtering, more specifically due to the temperatures required, oxygen is lost from the superconductor and hence a second oxygenation step that required similar times for the ramp up, dwell, and ramp down period, further extended the process by about 22 hours.

Figure 2:
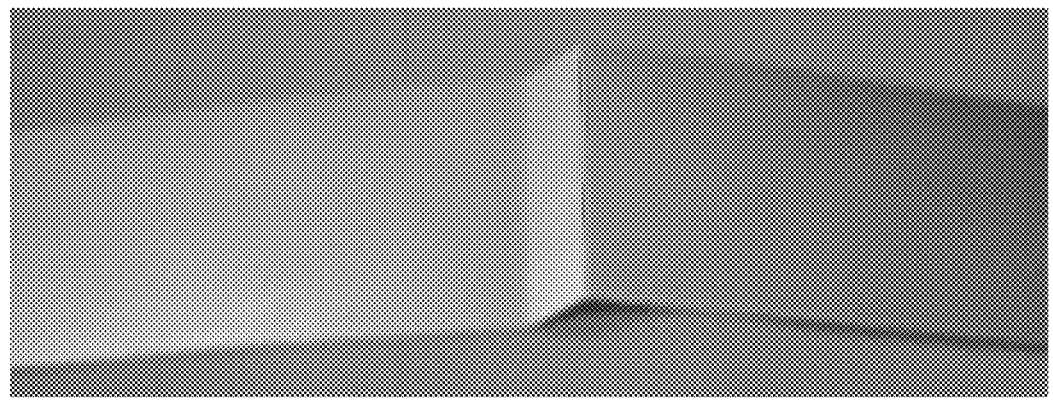
FIG. 2 illustrates a photograph of a superconducting tape damaged by a z-bend during handling after oxygenation process, the tape having been formed by a conventional manufacturing process.
Figure 3:
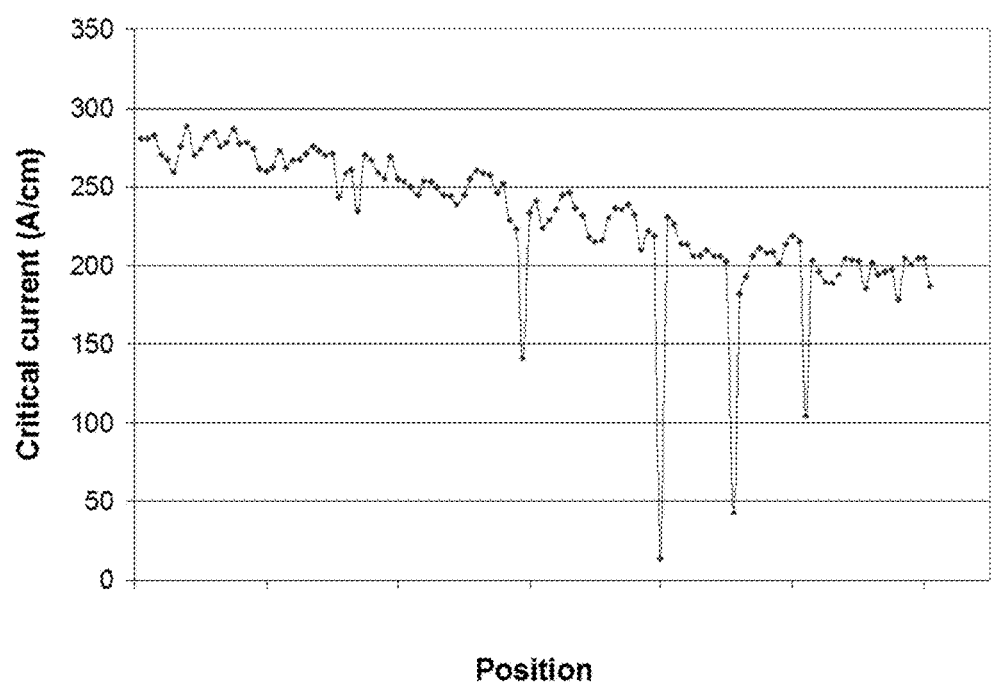
FIG. 3 illustrates a graph of the critical current drops at the locations where sharp z-bends occurred in the tape of FIG. 2 due to improper handling.

Further, the conventional process provides risks of damage to the superconducting tape. First, if the oxygenation step is not performed in a reel-to-reel mode, the spool of tape has to be manually loosened prior to oxygenation, because otherwise the turns of the tape could potentially weld together at the silver layer. Without limitation by theory, this causes damage to the superconductor at the weld location. Another type of damage that can occur is a z-bend such as that shown in FIG. 2 due to sudden change in tension while re-spooling the loosened tape after oxygenation. This also causes a sharp damage in the superconductor and loss of critical current at the bend location as shown in FIG. 3.

Efficient Process:

The oxygenation process originally used in devising the methods described hereinbelow begins with steps similar to those described above. However, in the present disclosure, the step of adding foreign elements into the superconducting film as potential flux pinning centers to improve critical current, included modifying the oxygenation process. In the present process, the oxygenation temperature was reduced to about 400° C. and the dwell time was decreased to about 30 minutes. Without limitation by theory, the purpose was to minimize the extent of any chemical reaction between the foreign elements and the superconducting film. These changes reduced the total time for an oxygenation step to about 9 hours, less than half that was normally required previously. Critical temperature and critical current measurements performed on the tapes that were subjected to the new process employing significantly reduced oxygenation time were found to be same as that in tapes processed with long oxygenation times.

Furthermore, it was found that by maintaining the temperature of the tape to less than about 250° C. during silver sputtering, the second oxygenation step can be eliminated without affecting the performance of the tape. The critical current measurements on tapes without a second oxygenation step showed the same values as those tapes including a second oxygenation step. Thus, the efficient superconducting tape manufacturing process disclosed herein was further modified after the first silver sputtering step as follows:

1. Oxygenation at 400° C. for about 30 minutes.
2. Slitting
3. Deposition of silver at temperature below 250° C. (eliminated)
4. Electroplating of copper The critical current of tapes fabricated with the disclosed process was found to be approximately equivalent to the critical current achieved by conventionally processed superconducting tapes. The process as disclosed herein may provide certain efficiencies in manufacturing cost and throughput of second-generation HTS tapes.

Also, the surface features of a low temperature silver sputtering process without a second oxygenation step were beneficial for subsequent copper electroplating steps. The properties and microstructure of silver film on 2G HTS tapes after oxygenation heat treatment at about 400° C. for about 30 min and at about 400° C. for about 10 hours were compared. Also, included in the comparison was silver film on 2G HTS tape after oxygenation heat treatment at about 400° C. for about 30 min followed by re-deposition of a second silver layer so as to mimic the processing history of a typical 2G HTS tape in the currently disclosed process.

Vickers hardness measurements were conducted on these three types of silver films on 2G HTS tapes using a micro-indenter and the results are provided in Table 1. It may be observed therefore in Table 1 that the hardness of the silver film after the long oxygenation time (i.e. via the conventional method) is only half as that of the silver film after short oxygenation time as disclosed herein. Furthermore, in instances it may be noted that the hardness does not change significantly after re-deposition of silver on the tape after a short oxygenation as disclosed in the present method.

TABLE I

Hardness of silver films on 2G HTS tapes after different oxygenation treatments

| | Oxygenation time | | |
|---|---|---|---|
| | (1) 400° C. for 30 min | (2) 400° C. for 10 hours | (3) Redeposited silver on (1) without oxygenation |
| Vickers Hardness | 140 | 72 | 139 |

Figure 4:
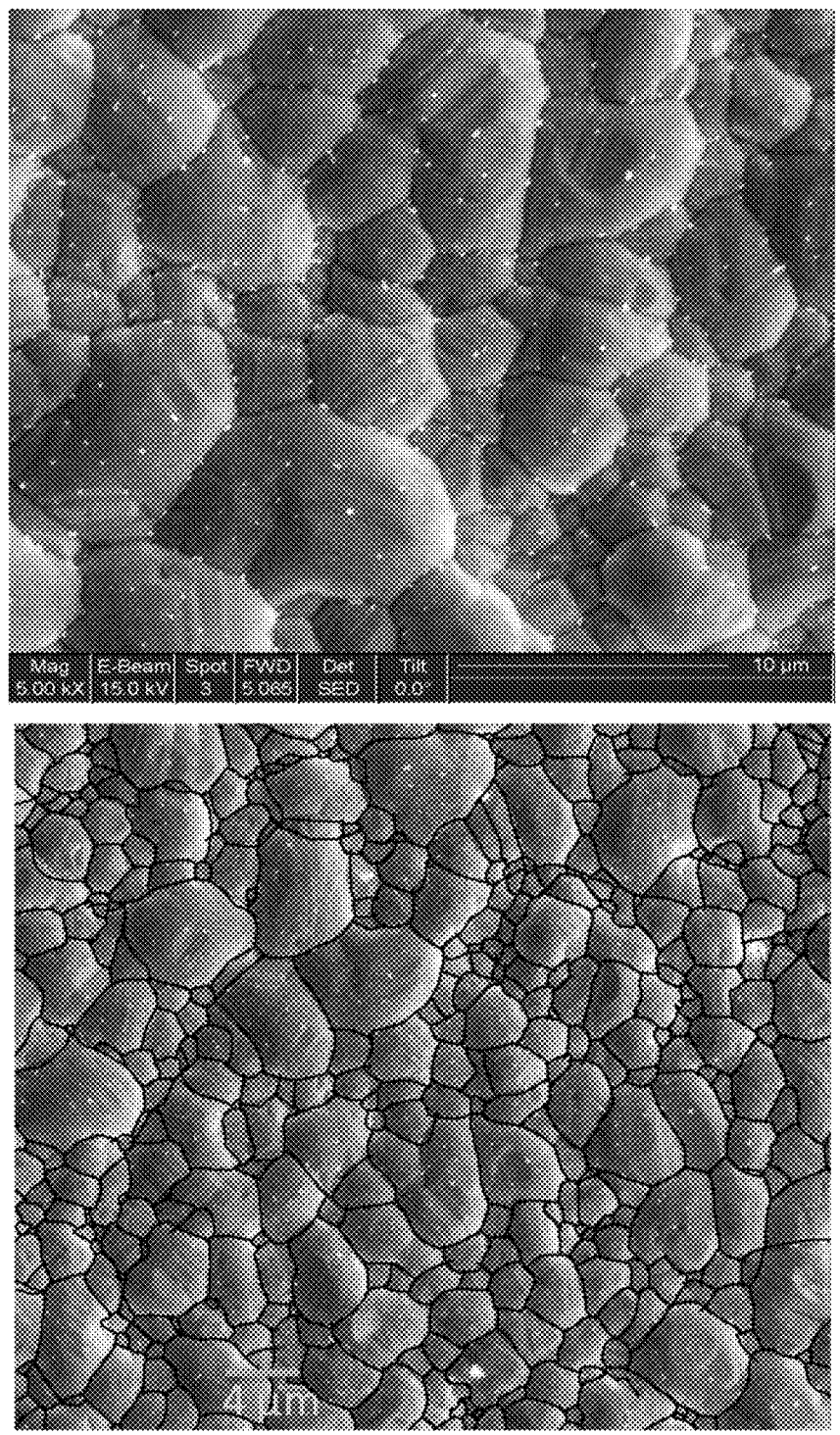
FIG. 4 illustrates electron micrographs of the microstructure of sputtered silver on superconducting film after oxygenation at 400° C. for 10 hours.
Figure 5A:
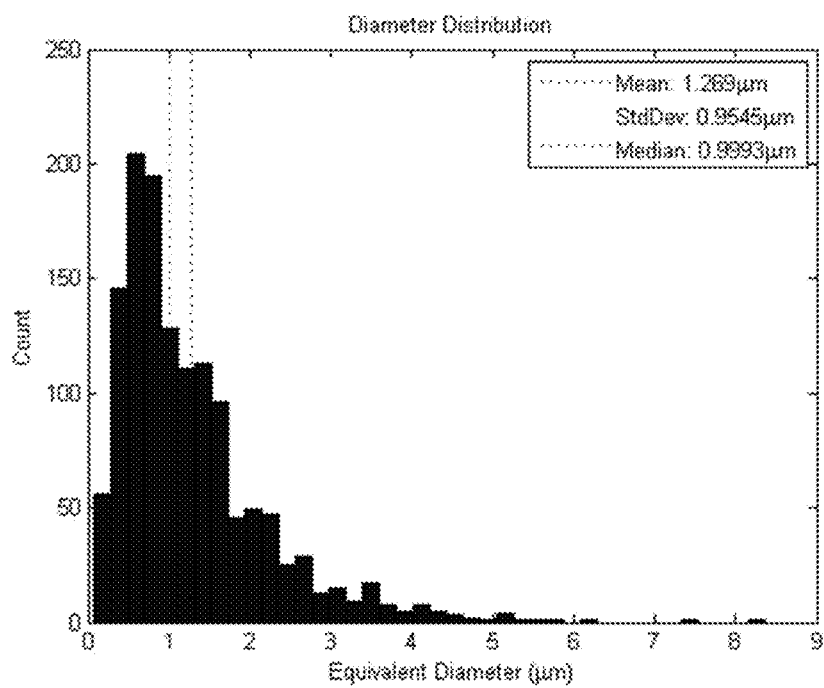
FIGS. 5 A-C graphically illustrates the grain size distribution in sputtered silver on superconducting film after oxygenation at 400° C. for 10 hours.
Figure 5B:
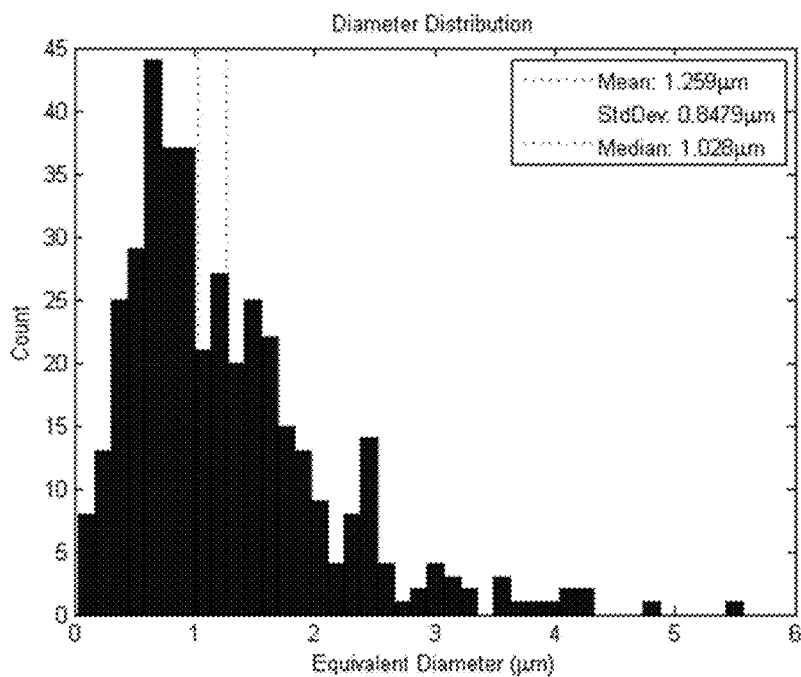
Figure 5C:
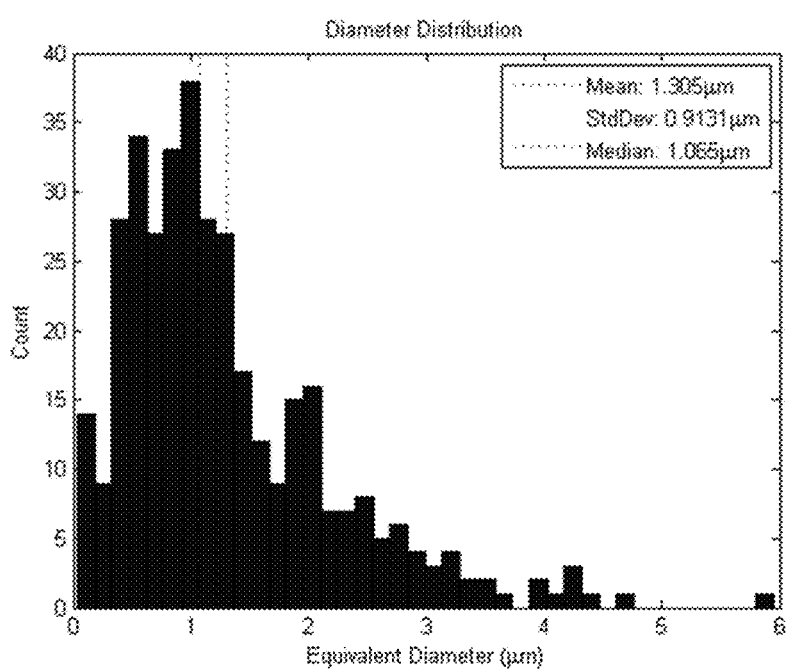

Additionally, grain size measurements were conducted on the three silver films. Referring now to FIG. 4, there is displayed the surface microstructure of a silver film on 2G HTS tape that was subjected to an oxygenation heat treatment at about 400° C. for about 10 hours and the results from statistical analysis of grain size measurements on this film are given in FIG. 5. As seen in the figures, grains of large sizes are present in the sample, extending to more than about 8 μm. However, most of the silver grains are found to be more than about 1 μm in size.

Figure 6:
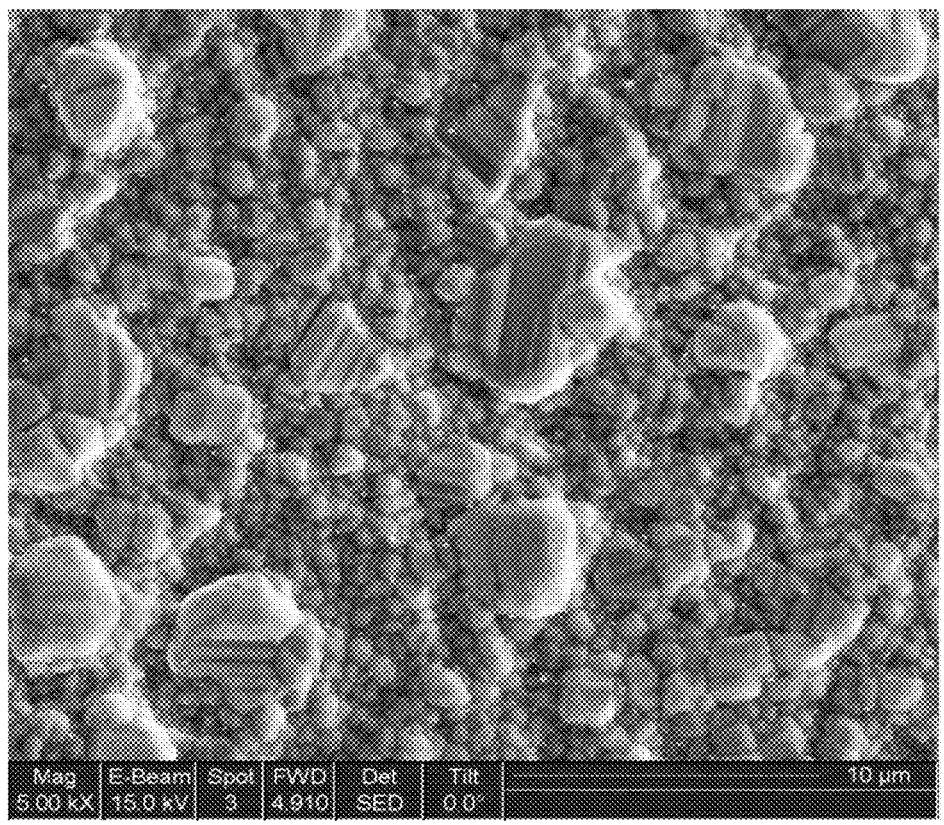
FIG. 6 illustrates an electron micrograph of the microstructure of sputtered silver on superconducting film after oxygenation at 400° C. for 30 minutes.
Figure 7:
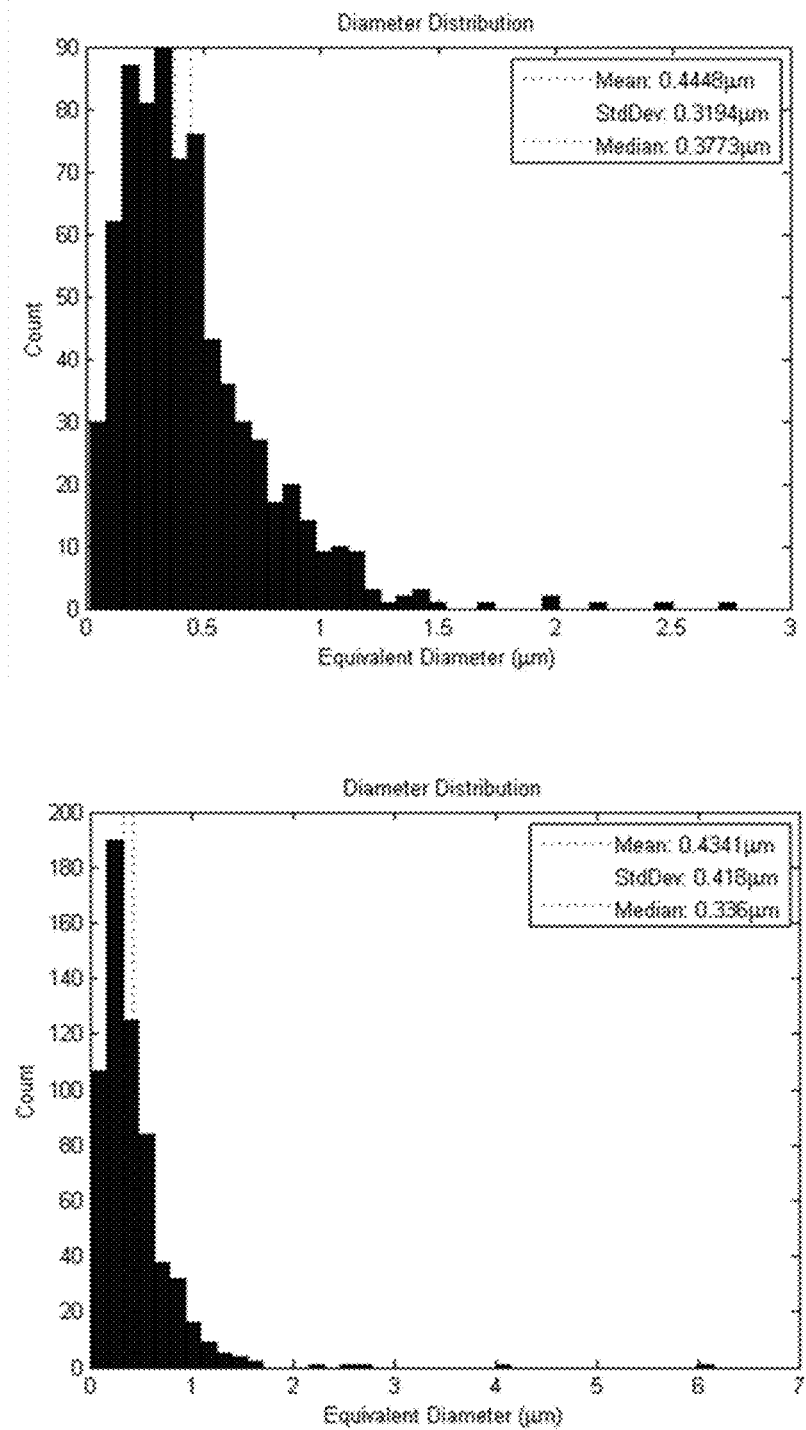
FIG. 7 graphically illustrates the grain size distribution of sputtered silver on superconducting film after oxygenation at 400° C. for 30 minutes.

FIG. 6 illustrates the surface microstructure of a silver film on 2G HTS tape that was subjected to an oxygenation heat treatment at about 400° C. for about 30 minutes and the results from statistical analysis of grain size measurements on this film are given in FIG. 7. As the figures illustrate, the grains are in the range from about sub-micrometer in size to a few large grains, having a size of about 5 μm.

Figure 8:
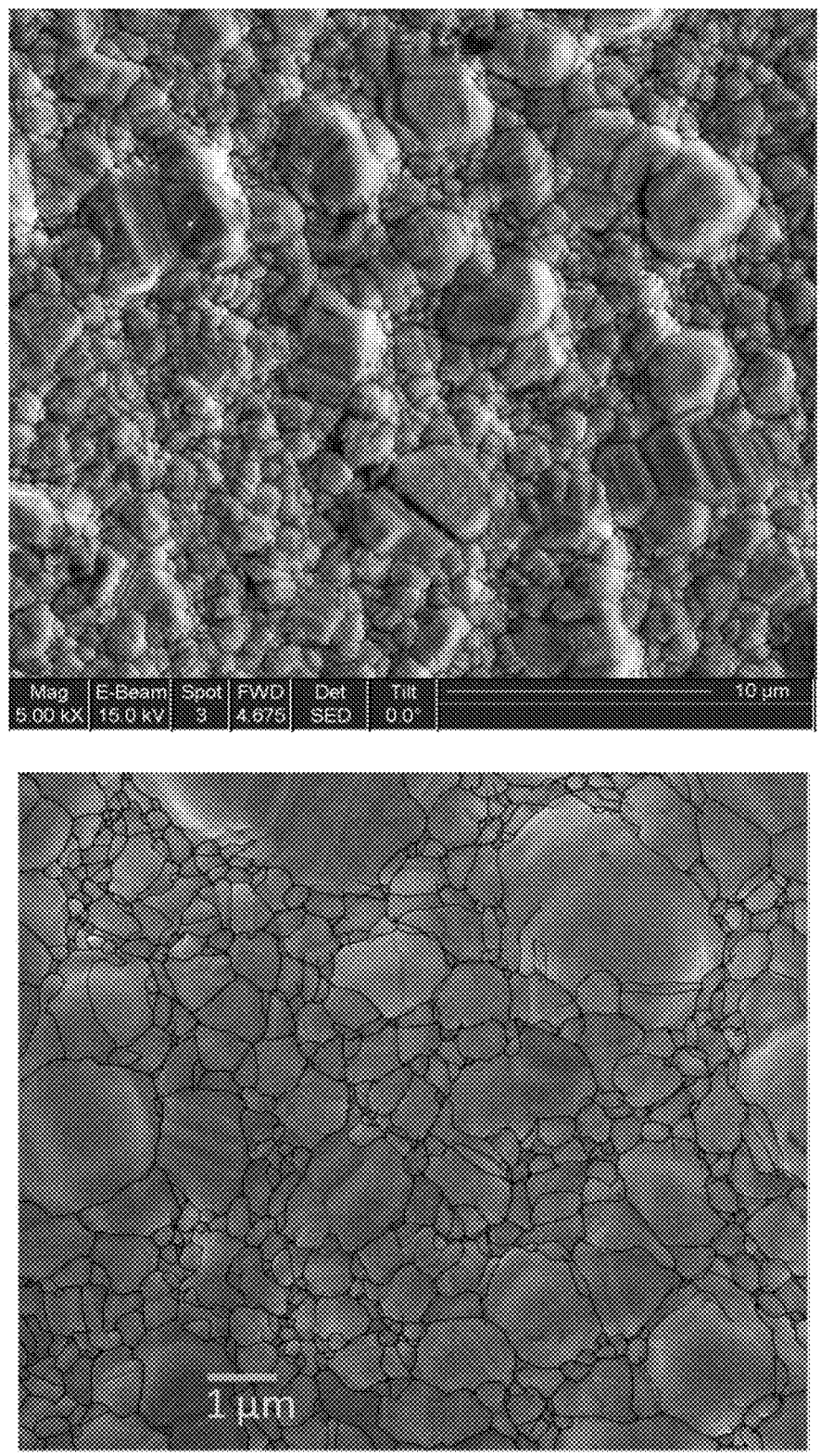
FIG. 8 illustrates electron micrographs of the microstructure of sputtered silver on superconducting film after oxygenation at 400° C. for 30 minutes and redeposition of a second layer of silver followed by no heat treatment.
Figure 9:
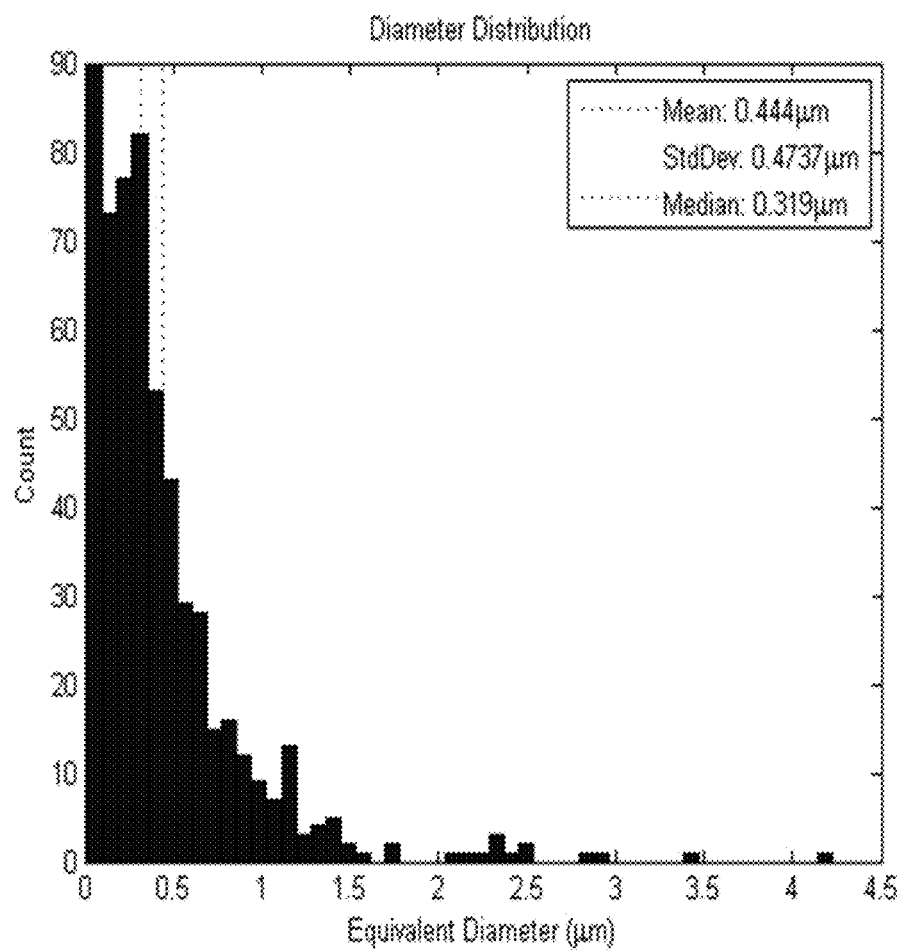
FIG. 9 graphically illustrates the grain size distribution of sputtered silver on superconducting film after oxygenation at 400° C. for 30 minutes and redeposition of a second layer of silver followed by no heat treatment FIG. 10 graphically illustrates the grain size distribution of sputtered silver on superconducting films after oxygenation at 400° C. for 30 minutes and after oxygenation at 400° C. for 10 hours.

Referring now to FIG. 8 there is shown the surface microstructure of a silver film on 2G HTS tape that was subjected to an oxygenation heat treatment at about 400° C. for about 30 minutes hours followed by a second layer of silver deposition. The results from statistical analysis of grain size measurements on this film are shown in FIG. 9. As seen in FIGS. 8 and 9, a significant proportion of the grains are sub-micrometer in size and range to only a few large grains as in the case of the silver film prior to the second silver deposition. Thus, in the present method the second silver deposition does not change the grain size distribution of the silver film. It may be understood that this is consistent with the hardness value of the film being the same before and after the silver re-deposition as shown in Table I, hereinabove.

Figure 10:
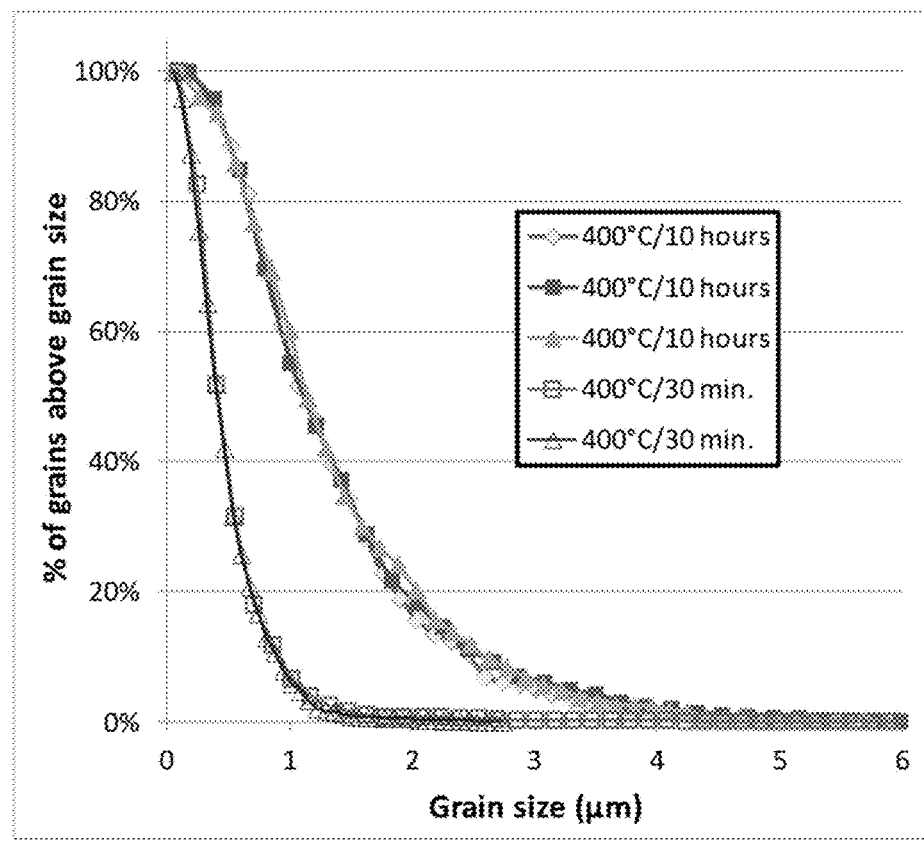

The statistical distribution of grain size in silver films in 2G HTS tapes after oxygenation at 400° C. for 10 hours and at 400° C. for 30 minutes is replotted in FIG. 10. In this figure, the percentage of grains above every measured grain size measured is shown. It is illustrated in this figure that about 60% of grains in the silver film in 2G HTS tapes oxygenated at 400° C. for 10 hours are over 1 μm in size whereas only about 6% of grains in the silver film in 2G HTS tapes oxygenated at 400° C. for 10 hours are over 1 μm in size.

Smaller grain sizes are generally preferred to provide improved strength. Hence, the small grain size distribution found in silver films in 2G HTS tapes made by the new manufacturing process disclosed herein. In which, in one configuration, the oxygenation time after the silver sputter is reduced to about 30 minutes and the oxygenation process after the second silver deposition, conducted also at temperatures below about 250° C., is eliminated has the characteristics of improved strength of the superconducting tape. Furthermore, the about two-fold higher hardness value measured in the tapes prepared by this method, compared to the tapes oxygenated at about 400° C. for about 10 hours is consistent with their smaller grain size distribution. Thus, the new manufacturing process can reduce the process time, yield a better microstructure, and improved properties.

Figure 11:
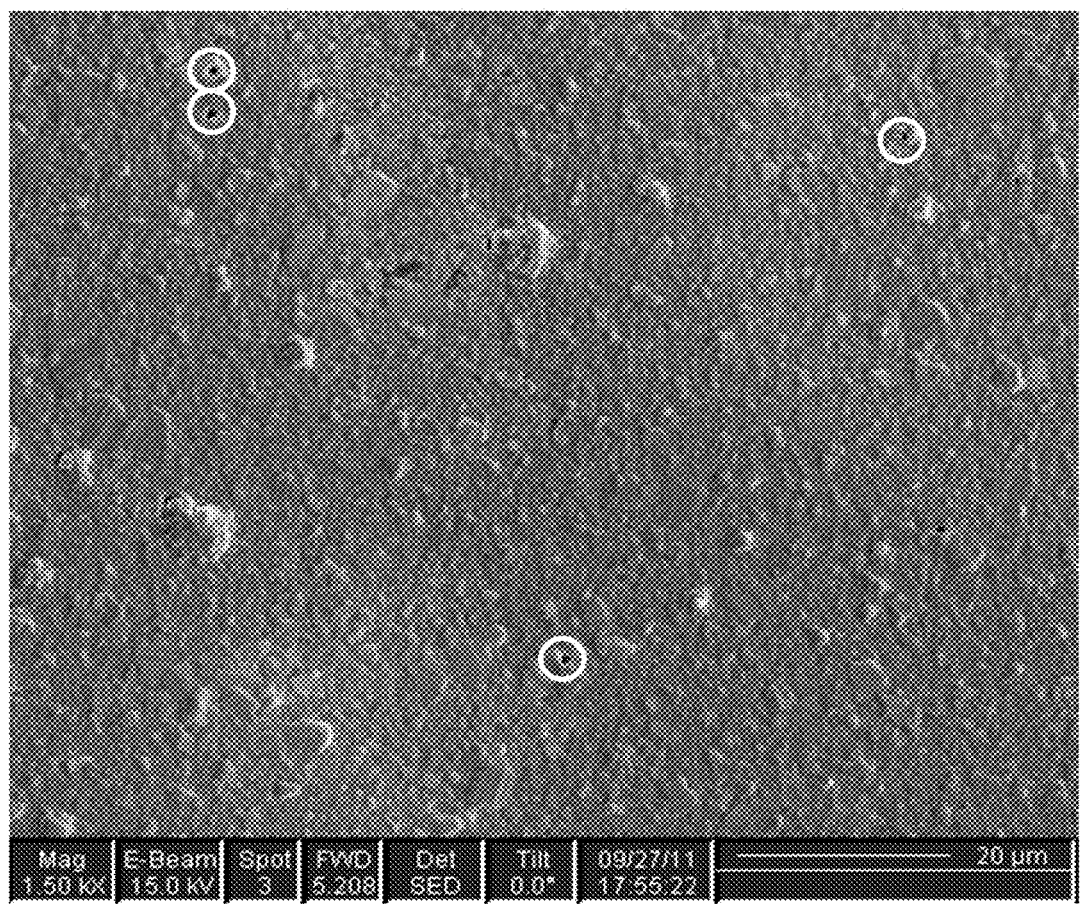
FIG. 11 illustrates electron micrographs of the microstructure of sputtered silver on superconducting film after oxygenation at 400° C. for 30 minutes with porosities circled.
Figure 12:
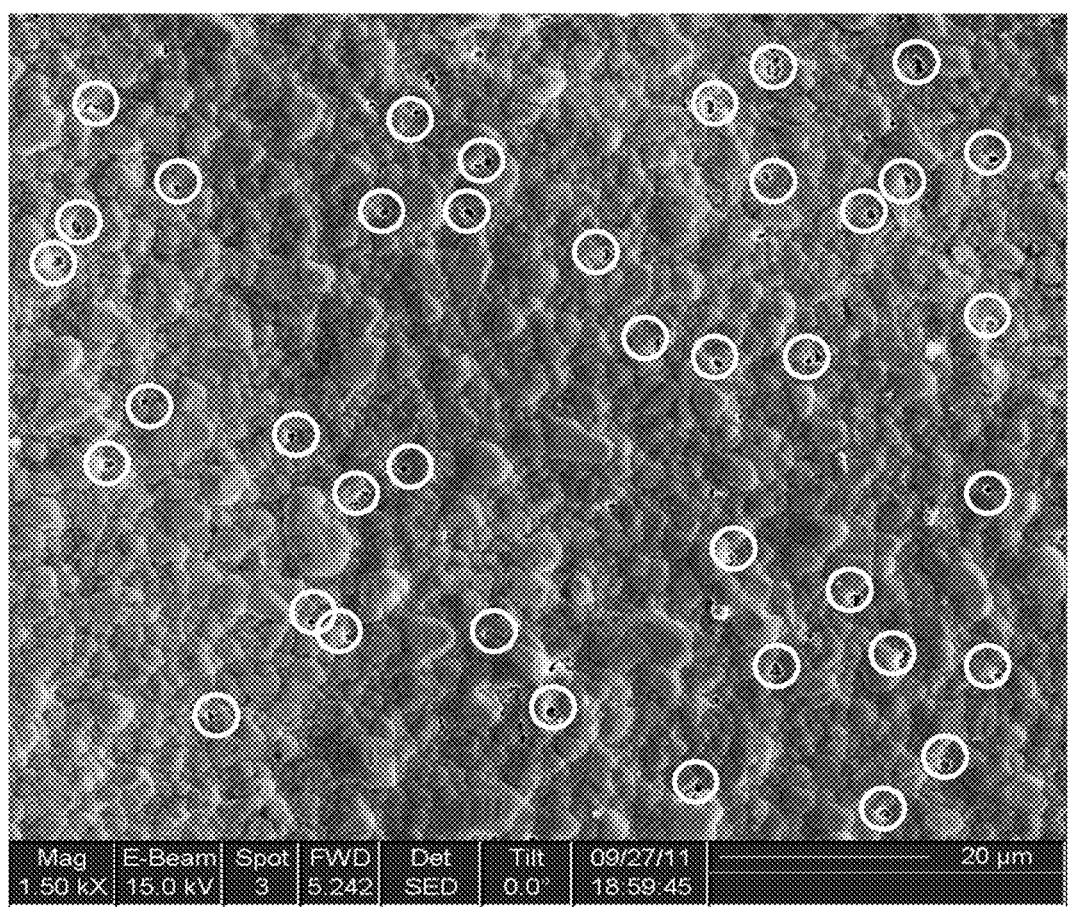
FIG. 12 illustrates electron micrographs of the microstructure of sputtered silver on superconducting film after oxygenation at 400° C. for 10 hours with porosities circled.
Figure 13:
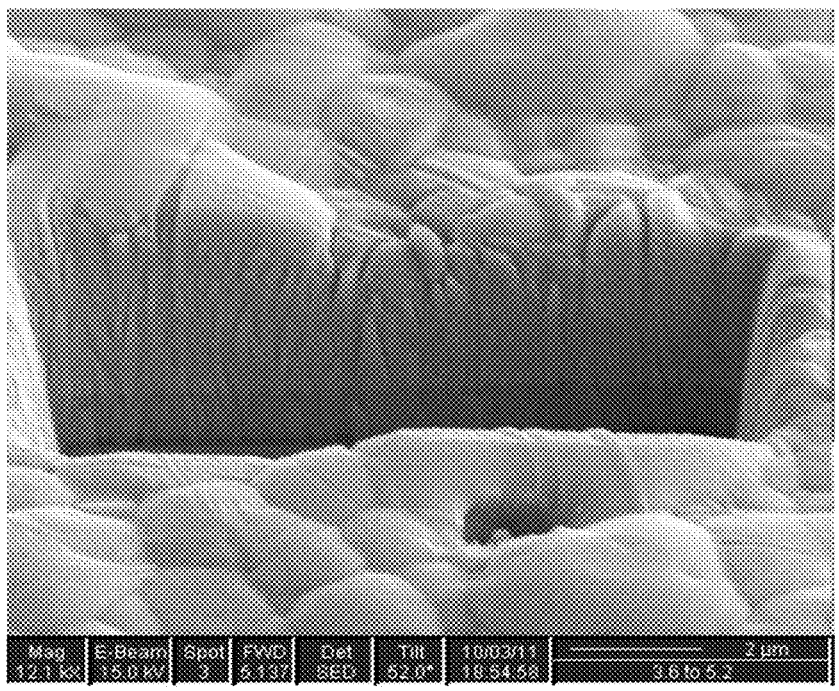
FIG. 13 illustrates electron micrographs of the cross-sectional microstructure of sputtered silver on superconducting film after oxygenation at 400° C. for 30 minutes with porosities circled.
Figure 13:
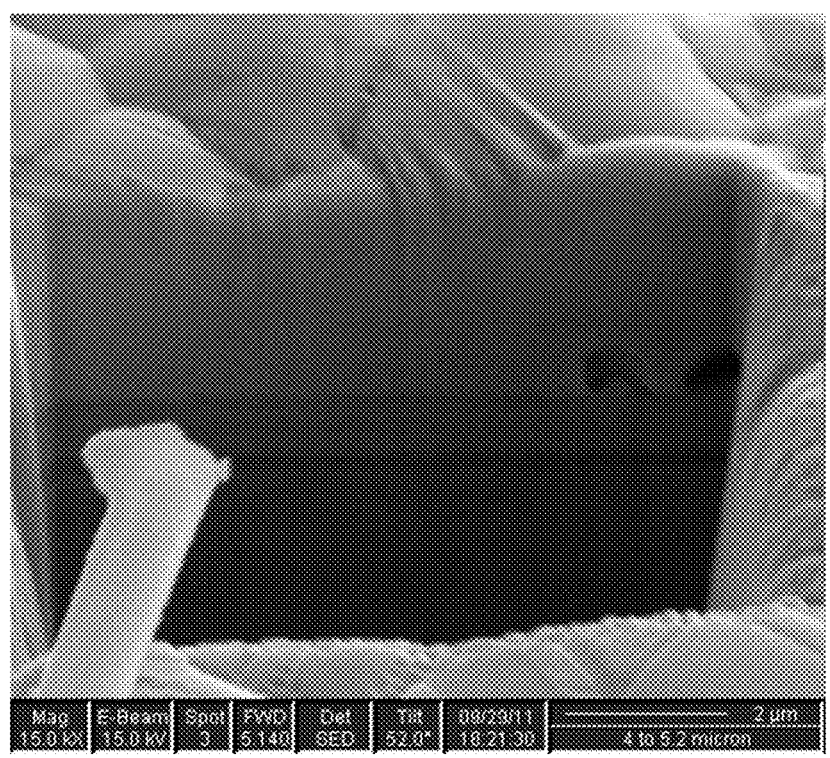

Furthermore, the short oxygenation time provides a reduced porosity in the silver film. FIGS. 11 and 12 are microstructures of the surfaces of silver film in 2G HTS tapes oxygenated at about 400° C. for about 30 minutes and at about 400° C. for 10 hours. A higher porosity is evident in the silver film in the tape oxygenated for a longer time. Additionally, FIG. 13 shows cross sectional views of microstructures of silver film in 2G HTS tapes oxygenated at about 400° C. for 30 minutes and at about 400° C. for 10 hours. The higher porosity is evident in the silver film in the tape oxygenated for a longer time, as with the conventional method. As may be understood by a skilled artisan, porosity affects mechanical robustness of the superconducting films or tapes. Also, those holes or pores that extend through all or most of the thickness of the silver film are extremely detrimental since they are easy paths for chemicals in acid electroplating solution used for copper stabilizer application to attack the superconducting film or tape. Such an attack deteriorates the critical current and carrying capacity as well as the delamination strength of the tape. Hence, the reduced porosity in silver films in 2G HTS tapes oxygenated for a short time according to the method disclosed herein provides additional benefit of the modified manufacturing process.

Exemplary embodiments of the invention are disclosed herein and variations, combinations, and/or modifications of such embodiment(s) may be made by a person having ordinary skill in the art and are within the scope of the disclosure. Alternative embodiments that result from combining, integrating, and/or omitting features of the expressly-disclosed embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . 50 percent, 51 percent, 52 percent . . . 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as "comprises", "includes", and "having" means "including but not limited to" and should be understood to also provide support for narrower terms such as "consisting of", "consisting essentially of", and "comprised substantially of." Accordingly, the scope of protection is not limited by the description set out above but is defined by the claims that follow, that scope including all equivalents of the subject matter of the claims. Each and every claim is incorporated as further disclosure into the specification, and each is an exemplary embodiment of the present invention. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural or other details supplementary to the disclosure.

I claim:

1. A superconducting tape comprising:
   a substrate;
   a biaxially-textured buffer layer overlying the substrate;
   a superconducting film on the buffer layer; and
   a silver layer deposited on the superconducting film, comprising:
      an oxygenated first silver layer comprising a porosity of less than about 1%, and
      a second silver layer formed on the first silver layer, wherein the second silver layer is not oxygenated,
   wherein the silver layer comprises less than about 20% of silver grains over about 1 μm in size.

2. The tape of claim 1, wherein the silver layer has a minimum Vickers micro-hardness value of about 100.

3. The tape of claim 1, further comprising a copper layer overlying the silver layer.

4. A superconducting tape comprising:
   a substrate;
   a biaxially-textured buffer layer overlying the substrate;
   a superconducting film on the buffer layer; and
   a silver layer deposited on the superconducting film, comprising:
      an oxygenated first silver layer, and
      a final silver layer disposed above the first silver layer, wherein the final silver layer is not oxygenated.

5. The tape of claim 4, wherein the silver layer comprises less than about 20% of silver grains over about 1 μm in size.

6. A superconducting tape comprising:
   a substrate;
   a biaxially-textured buffer layer overlying the substrate;
   a superconducting film on the buffer layer; and
   a silver layer deposited on the superconducting film, comprising:
      a first silver layer comprising a porosity of less than about 1%, and
      a second silver layer deposited on the first silver layer, wherein the second silver layer is not oxygenated, and wherein the silver layer comprises less than about 20% of silver grains over about 1 μm in size.

7. The tape of claim 6, wherein the silver layer has a minimum Vickers micro-hardness value of about 100.

8. A superconducting tape comprising:
   a substrate;
   a biaxially-textured buffer layer overlying the substrate;
   a superconducting film on the buffer layer; and
   a silver layer deposited on the superconducting film, comprising:
      a first silver layer, and
      a final silver layer disposed above the first silver layer, wherein the final silver layer is not oxygenated;
   wherein the first silver layer comprises a porosity of less than about 1%.

9. A superconducting tape comprising:
   a substrate;
   a biaxially-textured buffer layer overlying the substrate;
   a superconducting film on the buffer layer; and
   a silver layer deposited on the superconducting film, comprising:
      a first silver layer, and
      a final silver layer disposed above the first silver layer, wherein the final silver layer is not oxygenated;
   wherein the silver layer has a minimum Vickers micro-hardness value of about 100.

10. A superconducting tape comprising:
    a substrate;
    a biaxially-textured buffer layer overlying the substrate;
    a superconducting film on the buffer layer; and
    a silver layer deposited on the superconducting film, comprising:
       an oxygenated first silver layer; and
       a second silver layer deposited on the first silver layer, wherein the second silver layer is not oxygenated.

11. The tape of claim 10, wherein the silver layer comprises less than about 20% of silver grains over about 1 μm in size.

12. A superconducting tape comprising:
    a substrate;
    a biaxially-textured buffer layer overlying the substrate;
    a superconducting film on the buffer layer; and
    a silver layer deposited on the superconducting film, comprising:
       a first silver layer; and
       a second silver layer deposited on the first silver layer, wherein the second silver layer is not oxygenated;
    wherein the first silver layer comprises a porosity of less than about 1%.

13. A superconducting tape comprising:
    a substrate;
    a biaxially-textured buffer layer overlying the substrate;
    a superconducting film on the buffer layer; and
    a silver layer deposited on the superconducting film, comprising:
       a first silver layer; and
       a second silver layer deposited on the first silver layer, wherein the second silver layer is not oxygenated;
    wherein the silver layer has a minimum Vickers micro-hardness value of about 100.

14. A superconducting tape comprising:
    a substrate;
    a biaxially-textured buffer layer overlying the substrate;
    a superconducting film on the buffer layer; and
    a silver layer deposited on the superconducting film, comprising:
       an oxygenated first silver layer and a final silver layer, wherein the final silver layer is not oxygenated.

15. The tape of claim 14, wherein the silver layer comprises less than about 20% of silver grains over about 1 μm in size.

16. A superconducting tape comprising:
a substrate;
a biaxially-textured buffer layer overlying the substrate;
a superconducting film on the buffer layer; and
a silver layer deposited on the superconducting film, comprising:
   a first silver layer and a final silver layer,
wherein the final silver layer is not oxygenated; and
wherein the first silver layer comprises a porosity of less than about 1%.

17. A superconducting tape comprising:
a substrate;
a biaxially-textured buffer layer overlying the substrate;
a superconducting film on the buffer layer; and
a silver layer deposited on the superconducting film, comprising:
   a first silver layer and a final silver layer,
wherein the final silver layer is not oxygenated; and
wherein the silver layer has a minimum Vickers microhardness value of about 100.

\* \* \* \* \*